United States Patent
Chuang et al.

(10) Patent No.: US 10,497,861 B2
(45) Date of Patent: Dec. 3, 2019

(54) MANUFACTURING TECHNIQUES AND CORRESPONDING DEVICES FOR MAGNETIC TUNNEL JUNCTION DEVICES

(71) Applicant: Taiwan Semiconductor Manufacturing Co., Ltd., Hsin-Chu (TW)

(72) Inventors: Harry-Hak-Lay Chuang, Zhubei (TW); Hung Cho Wang, Taipei (TW); Tien-Wei Chiang, Taipei (TW); Wen-Chun You, Dongshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/601,095

(22) Filed: May 22, 2017

(65) Prior Publication Data
US 2017/0256704 A1 Sep. 7, 2017

Related U.S. Application Data

(62) Division of application No. 14/801,988, filed on Jul. 17, 2015, now Pat. No. 9,666,790.

(51) Int. Cl.
*H01L 29/82* (2006.01)
*H01L 43/12* (2006.01)
(Continued)

(52) U.S. Cl.
CPC ............ *H01L 43/12* (2013.01); *H01L 27/228* (2013.01); *H01L 43/08* (2013.01)

(58) Field of Classification Search
CPC .. H01L 43/08; H01L 21/67709; H01L 27/222
(Continued)

(56) References Cited

U.S. PATENT DOCUMENTS 8,536,063 B2 9/2013 Satoh et al.
8,907,435 B2 * 12/2014 Lee .................... H01L 43/12
257/421
(Continued)

FOREIGN PATENT DOCUMENTS

| CN | 104518082 A | 4/2015 |
| JP | 2003086772 A | 3/2003 |
| WO | 2009131944 A1 | 10/2009 |

OTHER PUBLICATIONS

Non-Final Office Action dated Sep. 8, 2016 for U.S. Appl. No. 14/801,988.
(Continued)

*Primary Examiner* — Tan N Tran
(74) *Attorney, Agent, or Firm* — Eschweiler & Potashnik, LLC

(57) ABSTRACT

Some embodiments relate to a magnetoresistive random-access memory (MRAM) cell. The cell includes a bottom electrode having a central bottom electrode portion surrounded by a peripheral bottom electrode portion. Step regions of the conductive bottom electrode couple the central and peripheral bottom electrode portions to one another such that an upper surface of the central portion is recessed relative to an upper surface of the peripheral portion. A magnetic tunneling junction (MTJ) has MTJ outer sidewalls which are disposed over the bottom central electrode portion and which are arranged between the step regions. A top electrode is disposed over an upper surface of the MTJ. Other devices and methods are also disclosed.

20 Claims, 8 Drawing Sheets

(51) Int. Cl.
*H01L 27/22* (2006.01)
*H01L 43/08* (2006.01)

(58) Field of Classification Search
USPC .................................. 257/421, 427, 428, 422
See application file for complete search history.

(56) References Cited

U.S. PATENT DOCUMENTS

| | | |
|---|---|---|
| 9,196,823 B2 * | 11/2015 | Nagamine ............... H01L 43/02 |
| 9,324,937 B1 | 4/2016 | Annunziata et al. |
| 9,614,143 B2 * | 4/2017 | Lu .......................... H01L 27/222 |
| 2003/0087130 A1 | 5/2003 | Sugawara |
| 2003/0203510 A1 | 10/2003 | Hineman et al. |
| 2009/0227045 A1 | 9/2009 | Li |
| 2009/0261434 A1 | 10/2009 | Kang et al. |
| 2013/0015541 A1 | 1/2013 | Kanaya |
| 2013/0026585 A1 | 1/2013 | Sung et al. |
| 2013/0043549 A1 | 2/2013 | Huang et al. |
| 2013/0058156 A1 | 3/2013 | Ohno et al. |
| 2013/0119494 A1 | 5/2013 | Li et al. |
| 2015/0056722 A1 | 2/2015 | Li et al. |
| 2015/0069541 A1 | 3/2015 | Chen et al. |
| 2015/0090949 A1 | 4/2015 | Chang et al. |
| 2015/0311251 A1 * | 10/2015 | Yi .......................... H01L 27/222 257/421 |
| 2016/0099288 A1 * | 4/2016 | Watanabe ............. H01L 27/228 257/295 |

OTHER PUBLICATIONS

Notice of Allowance dated Jan. 19, 2017 for U.S. Appl. No. 14/801,988.

* cited by examiner

MANUFACTURING TECHNIQUES AND CORRESPONDING DEVICES FOR MAGNETIC TUNNEL JUNCTION DEVICES

REFERENCE TO RELATED APPLICATION

This Application is a Divisional of U.S. application Ser. No. 14/801,988 filed on Jul. 17, 2015, the contents of which are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its data memory contents when power is lost. Magnetoresistive random-access memory (MRAM) is one promising candidate for next generation of non-volatile electronic memory due to advantages over current electronic memory. Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
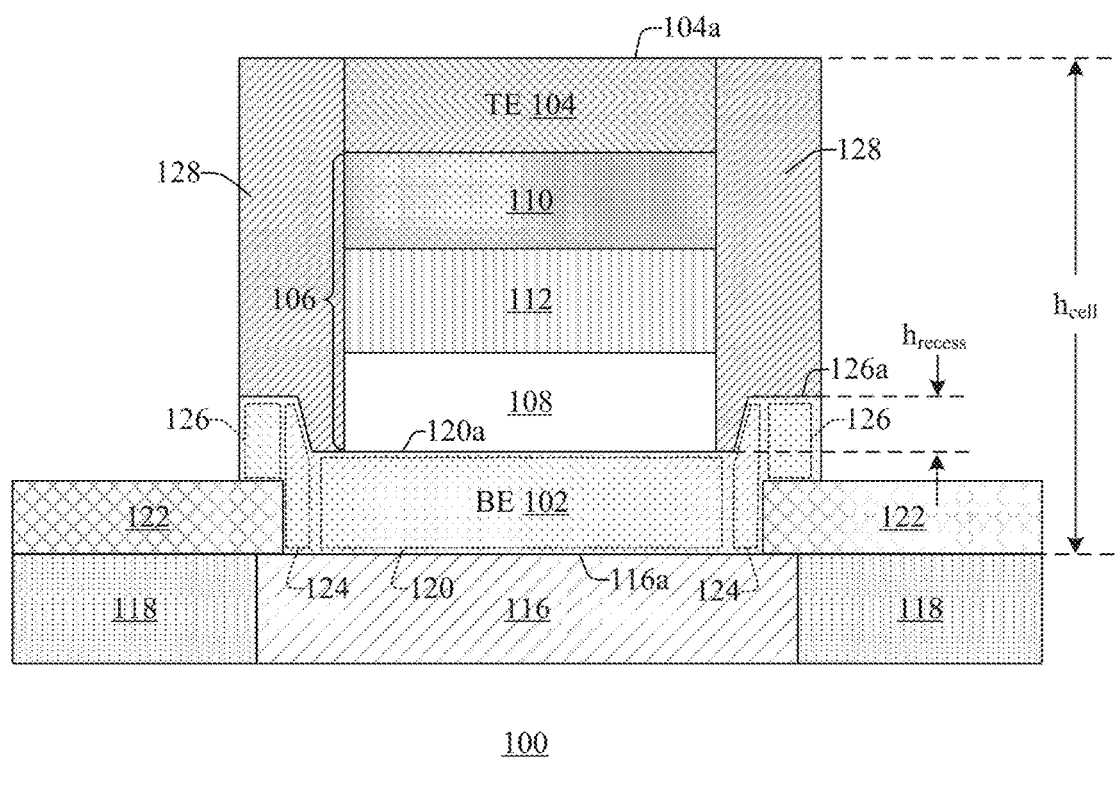
FIG. 1 illustrates a cross-sectional view of some embodiments of an MRAM cell, including a magnetic tunneling junction (MTJ), according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetoresistive random-access memory (MRAM) cell includes upper and lower electrodes, and a magnetic tunnel junction (MTJ) arranged between the upper and lower electrodes. In conventional MRAM cells, the lower electrode is coupled to an underlying metal layer (e.g., metal 1, metal 2, metal 3, etc.) by a contact or via. Although use of this coupling contact or via is widely adopted, the overall height of this underlying contact or via plus the MRAM cell thereover is large relative to typical vertical spacing between adjacent metal layers (e.g., between a metal 2 layer and a metal 3 layer). To make this height more in line with the vertical spacing between adjacent metal layers, the present disclosure couples the lower electrodes of MRAM cells directly to an underlying metal layer without the use of contacts or vias. Advantageously, by forming the lower electrode of the MRAM cell in direct electrical contact with the underlying metal layer without a contact or via there between (e.g., by "squeezing out" the conventional contact or via), the improved MRAM cell has a shorter profile and is more compatible with existing back end of line (BEOL) metallization techniques. Further, whereas traditional MRAM devices have required the use a chemical mechanical planarization (CMP) operation to planarize an upper surface of the bottom electrode, aspects of the present disclosure can avoid the use of this CMP operation. Avoiding this CMP operation helps to streamline manufacturing, which can help reduce manufacturing costs, limit various types of defects, and improve yields.

Referring to FIG. 1, a cross-sectional view of an MRAM cell 100 in accordance with some embodiments is provided. The MRAM cell 100 includes a bottom electrode 102 and a top electrode 104, which are separated from one another by a magnetic tunnel junction (MTJ) 106. The MTJ 106 includes a lower ferromagnetic electrode 108 and an upper ferromagnetic electrode 110, which are separated from one another by a tunneling barrier layer 112. In some embodiments, the lower ferromagnetic electrode 108 can have a fixed or "pinned" magnetic orientation, while the upper ferromagnetic electrode 110 has a variable or "free" magnetic orientation, which can be switched between two or more distinct magnetic polarities that each represents a different data state, such as a different binary state. In other implementations, however, the MTJ 106 can be vertically "flipped", such that the lower ferromagnetic electrode has a "free" magnetic orientation, while the upper ferromagnetic electrode 110 has a "pinned" magnetic orientation.

Notably, rather than a contact or via coupling the bottom electrode 102 to an underlying metal layer 116 (underlying metal layer 116 is disposed within inter-metal dielectric (IMD) layer 118), the bottom electrode 102 itself is in direct electrical contact with the underlying metal layer 116. To achieve this coupling, the bottom electrode 102 has a central bottom electrode portion 120 which extends downwardly through an IMD-protection layer 122 to contact the underlying metal layer 116. Step regions 124 extend upwardly from the central portion of the bottom electrode (120) and along the sidewalls of the IMD-protection layer 122 to couple the central portion of the bottom electrode (120) to peripheral bottom electrode portions (126), such that an upper surface of the central portion (120a) is recessed relative to an upper surface of the peripheral portion (126a). The central bottom electrode portion 120, step regions 124, and peripheral portions 126 can be a continuous, seamless body of material. The upper surface of the central portion (120a) can be substantially and continuously planar between the step regions 124, and a lower surface of the MTJ 106 is disposed on the upper surface of the central portion 120a. Sidewall spacers 128 extend continuously over upper surfaces of the peripheral portions 126, step region 124, and optionally outer portions of central bottom electrode portion 120, and extend upwardly along sidewalls of the MTJ 106 and top electrode 104.

Because there is no via or contact between the bottom electrode 102 and underlying metal layer 116 and because the upper surface of the central portion (120a) is recessed, the overall height of the MRAM cell, $h_{cell}$ (as measured from the uppermost surface of the underlying metal layer (116a) to upper surface of top electrode (104a)) can be reduced relative to previous approaches. Compared to previous approaches, this reduced height, $h_{cell}$, makes the MRAM cell 100 more easily compatible with BEOL process flows.

Figure 2:
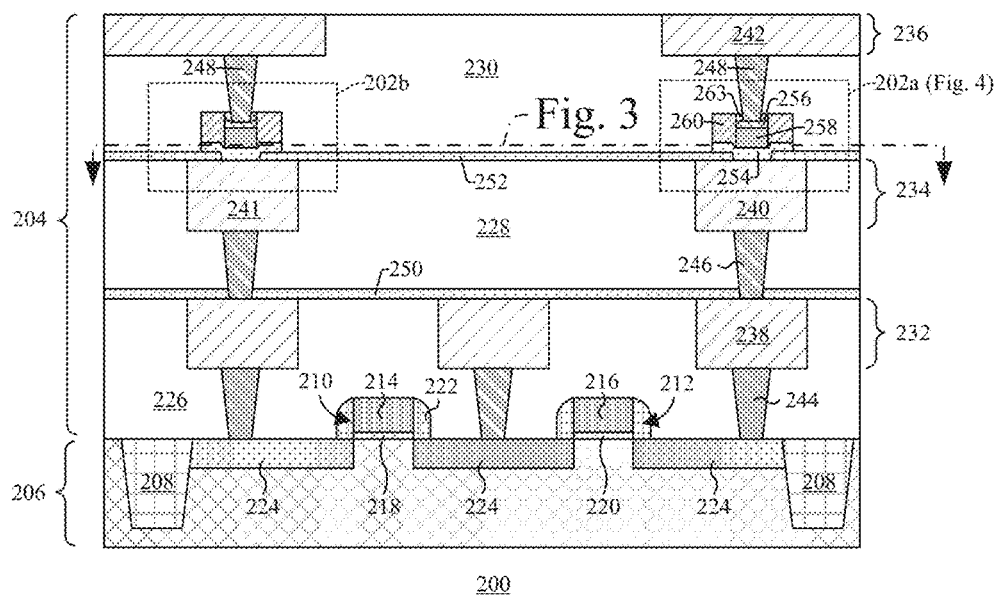
FIG. 2 illustrates a cross-sectional view of some embodiments of an integrated circuit including MRAM cells.

FIG. 2 illustrates a cross sectional view of some embodiments of an integrated circuit 200, which includes MRAM cells 202a, 202b disposed in an interconnect structure 204 of the integrated circuit 200. The integrated circuit 200 includes a substrate 206. The substrate 206 may be, for example, a bulk substrate (e.g., a bulk silicon substrate) or a silicon-on-insulator (SOI) substrate. The illustrated embodiment depicts one or more shallow trench isolation (STI) regions 208, which may include a dielectric-filled trench within the substrate 206.

Two word line transistors 210, 212 are disposed between the STI regions 208. The word line transistors 210, 212 include word line gate electrodes 214, 216, respectively; word line gate dielectrics 218, 220, respectively; word line sidewall spacers 222; and source/drain regions 224. The source/drain regions 224 are disposed within the substrate 206 between the word line gate electrodes 214, 216 and the STI regions 208, and are doped to have a first conductivity type which is opposite a second conductivity type of a channel region under the gate dielectrics 218, 220, respectively. The word line gate electrodes 214, 216 may be, for example, doped polysilicon or a metal, such as aluminum, copper, or combinations thereof. The word line gate dielectrics 218, 220 may be, for example, an oxide, such as silicon dioxide, or a high-κ dielectric material. The word line sidewall spacers 222 can be made of SiN, for example.

The interconnect structure 204 is arranged over the substrate 206 and couples devices (e.g., transistors 210, 212) to one another. The interconnect structure 204 includes a plurality of IMD layers 226, 228, 230, and a plurality of metallization layers 232, 234, 236 which are layered over one another in alternating fashion. The IMD layers 226, 228, 230 may be made, for example, of a low κ dielectric, such as un-doped silicate glass, or an oxide, such as silicon dioxide, or an extreme low κ dielectric layer. The metallization layers 232, 234, 236 include metal lines 238, 240, 241, 242, which are formed within trenches, and which may be made of a metal, such as copper or aluminum. Contacts 244 extend from the bottom metallization layer 232 to the source/drain regions 224 and/or gate electrodes 214, 216; and vias 246, 248 extend between the metallization layers 232, 234, 236. The contacts 244 and the vias 246, 248 extend through dielectric-protection layers 250, 252 (which can be made of dielectric material and can act as etch stop layers during manufacturing). The dielectric-protection layers 250, 252 may be made of an extreme low-κ dielectric material, such as SiC, for example. The contacts 244 and the vias 246, 248 may be made of a metal, such as copper or tungsten, for example.

MRAM cells 202a, 202b, which are configured to store respective data states, are arranged within the interconnect structure 204 between neighboring metal layers. The MRAM cell 202a includes a bottom electrode 254 and a top electrode 256, which are made of conductive material. Between its top and bottom electrodes 254, 256, MRAM cell 202a includes an MTJ 258. MRAM cell 202a also includes MRAM sidewall spacers 260. In some embodiments, a hardmask 263 covers the top electrode 256, and via 248 extends downwardly through hardmask 263 to ohmically contact top electrode 256. More commonly, however, the hardmask 263 and/or via 248 are not present, and for example, the metal line 242 can be co-planar with and in direct electrical contact with (e.g., ohmically coupled to) a top surface of top electrode 256 (see e.g., FIG. 16 further herein).

Figure 3:
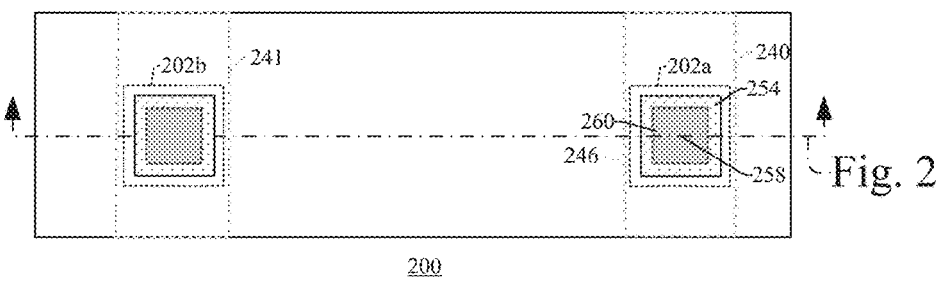
FIG. 3 illustrates a top view of some embodiments of FIG. 2's integrated circuit including MRAM cells.

FIG. 3 depicts some embodiments of a top view of FIG. 2's integrated circuit 200 as indicated in the cut-away lines shown in FIGS. 2-3. As can be seen, the MRAM cells 202a, 202b can have a square or rectangular shape in some embodiments. In other embodiments, however, for example due to practicalities of many etch processes, the corners of the illustrated square shape can become rounded, resulting in MRAM cells 202a, 202b having a square or rectangular shape with rounded corners, or having a circular or oval shape. The MRAM cells 202a, 202b are arranged over metal lines 240, 241, respectively, and have bottom electrodes 254 in direct electrical connection with the metal lines 240, 241, respectively, without vias or contacts there between.

Figure 4:
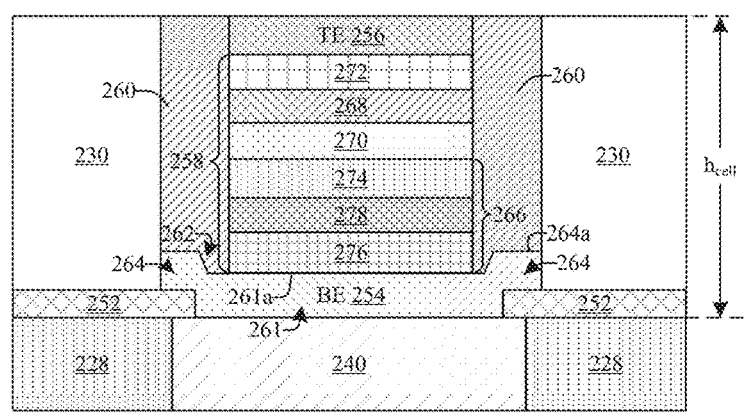
FIG. 4 illustrates an enlarged cross-sectional view an MRAM cell of FIG. 2's integrated circuit.

Referring now to FIG. 4, an enlarged cross-sectional view of FIG. 2's MRAM cell 202a is provided. As shown, the MRAM cell 202a includes bottom electrode 254 and top electrode 256 with MTJ 258 disposed between the bottom electrode 254 and top electrode 256. A central portion of the bottom electrode (261) extends downwardly through in an opening in the dielectric-protection layer 252 to make electrical contact with underlying metal line 240. The central portion of the bottom electrode (261) has a bottom electrode width, which can be equal to a width of a via. Step regions 262 extend upwardly from the central portion of the bottom electrode, and peripheral regions 264 extend outwardly from the step regions. The central region has an upper surface 261a that is recessed relative to upper surface of peripheral regions 264a, and the MTJ 258 is disposed on this upper surface 261a. Sidewall spacers 260 are disposed over the peripheral portions of the bottom electrode 264.

In the illustrated embodiment, the MTJ 258 includes a lower ferromagnetic electrode 266 (which can have a pinned magnetic orientation) and an upper ferromagnetic electrode 268 (which can have a free magnetic orientation). A tunneling barrier layer 270 is disposed between the lower and upper ferromagnetic electrodes 266, 268; and a capping layer 272 is disposed over the upper ferromagnetic electrode 268. The lower ferromagnetic electrode 266 can be a synthetic anti-ferromagnetic (SAF) structure that includes a top pinned ferromagnetic layer 274, a bottom pinned ferromagnetic layer 276, and a metal layer 278 sandwiched between the top and bottom pinned ferromagnetic layers 274, 276.

In some embodiments, the upper ferromagnetic electrode 268 comprises Fe, Co, Ni, FeCo, CoNi, CoFeB, FeB, FePt, FePd, or the like, and has a thickness ranging between approximately 8 angstroms and approximately 13 angstroms. In some embodiments, the capping layer 272 comprises $WO_2$, NiO, MgO, $Al_2O_3$, $Ta_2O_5$, $MoO_2$, $TiO_2$, GdO, Al, Mg, Ta, Ru, or the like. In some embodiments, the tunneling barrier layer 270 provides electrical isolation between the upper ferromagnetic electrode 268 and the lower ferromagnetic electrode 266, while still allowing electrons to tunnel through the tunneling barrier layer 270 under proper conditions. The tunneling barrier layer 270 may comprise, for example, magnesium oxide (MgO), aluminum oxide (e.g., $Al_2O_3$), NiO, GdO, $Ta_2O_5$, $MoO_2$, $TiO_2$, $WO_2$, or the like. Further, the tunneling barrier layer 270 may be, for example, about 0.5-2 nanometers thick.

In operation, the variable magnetic polarity of the upper (e.g., free) ferromagnetic electrode 268 is typically read by measuring the resistance of the MTJ 258. Due to the magnetic tunnel effect, the resistance of the MTJ 258 changes with the variable magnetic polarity. Further, in operation, the variable magnetic polarity is typically changed or toggled using the spin-transfer torque (STT) effect. According to the STT effect, current is passed across the MTJ 258 to induce a flow of electrons from the lower (e.g., pinned) ferromagnetic electrode 266 to the upper (e.g., free) ferromagnetic electrode 268. As electrons pass through the lower ferromagnetic electrode 266, the spins of the electrons are polarized. When the spin-polarized electrons reach the upper ferromagnetic electrode 268, the spin-polarized electrons apply a torque to the variable magnetic polarity and toggle the state of the upper ferromagnetic electrode 268. Alternative approaches to reading or changing the variable magnetic polarity are also amenable. For example, in some alternate approaches magnetization polarities of the pinned and/or free ferromagnetic electrodes 266/268 are perpendicular to an interface between the tunneling barrier layer 270 and the pinned and/or free ferromagnetic electrode 266/268, making the MTJ 258 a perpendicular MTJ.

Advantageously, because the bottom electrode 254 itself is in direct electrical contact with the underlying metal line 240, the overall height of the MRAM cells 202a, 202b can be reduced relative to previous approaches. Compared to previous approaches, this reduced height makes the MRAM cells 202a, 202b more easily compatible with BEOL process flows. Thus, formation of MRAM cells 202a, 202b provides better MRAM operations with reduced manufacturing cost.

Figure 5:
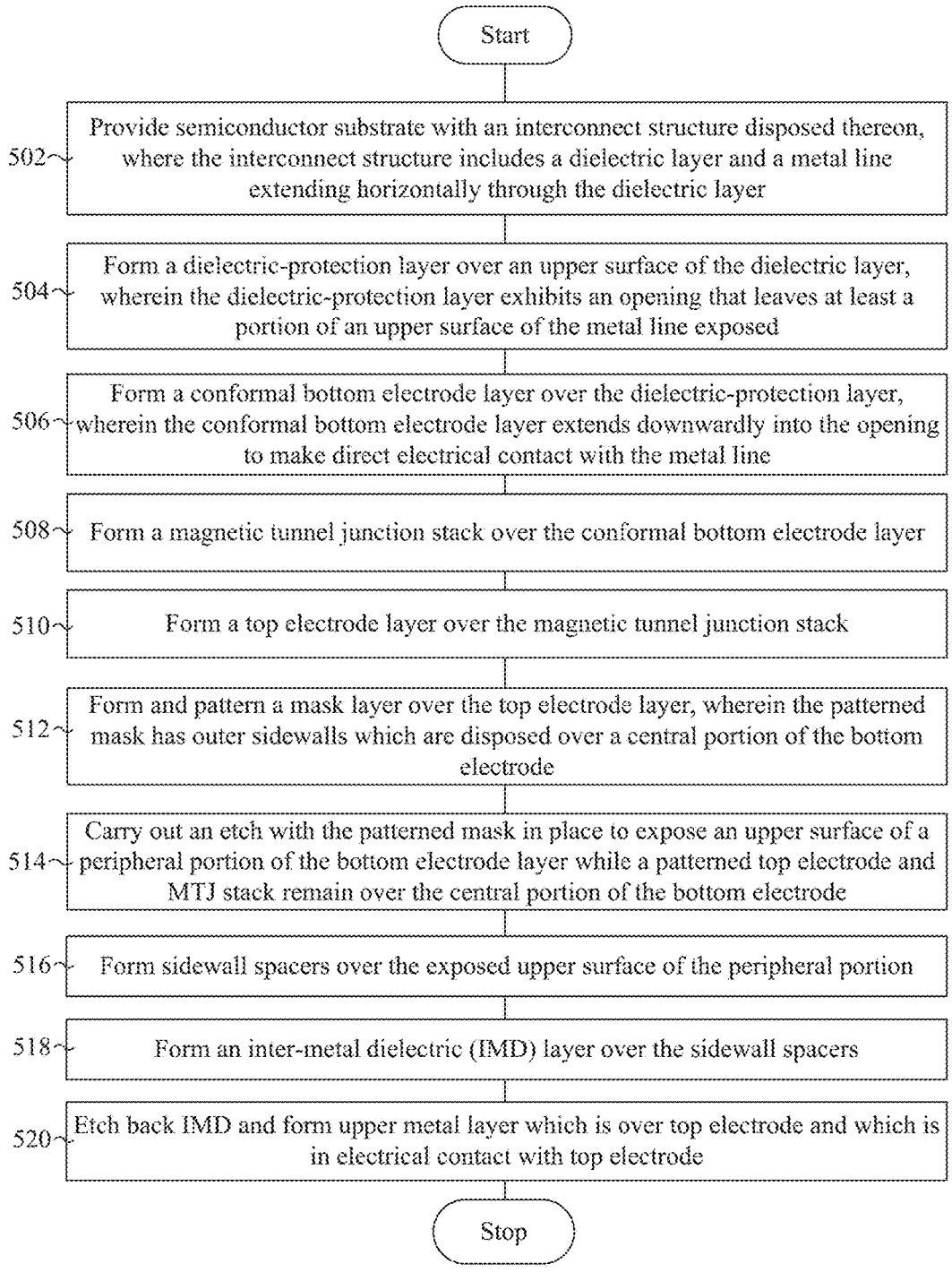
FIG. 5 illustrates a flow chart of some embodiments of a method for manufacturing an MRAM cell according to the present disclosure.

With reference to FIG. 5, a flowchart illustrates some embodiments of a method 500 for manufacturing a semiconductor structure having a MRAM cell according to some embodiments of the present disclosure. It will be appreciated that the illustrated method is not interpreted in a limiting sense, and that alternate methods for forming a MRAM cell may also be considered within the scope of the disclosure.

At 502, a semiconductor substrate with an interconnect structure disposed thereon is provided. The interconnect structure includes a dielectric layer and a metal line extending horizontally through the dielectric layer.

At 504, a dielectric-protection layer, which can be made of dielectric material and can act as etch stop, is formed over an upper surface of the dielectric layer. The dielectric-protection layer exhibits an opening that leaves at least a portion of an upper surface of the metal line exposed.

At 506, a conformal bottom electrode layer is formed over the dielectric-protection layer. The conformal bottom electrode layer extends downwardly into the opening to make direct electrical contact with the metal line.

At 508, a magnetic tunnel junction (MTJ) stack is formed over the conformal bottom electrode layer. The MTJ stack can include upper and lower ferromagnetic layers, which are spaced apart by a tunneling barrier layer. One of the lower and upper ferromagnetic layers is a pinned layer with a fixed ferromagnetic polarity, while the other of the lower and upper ferromagnetic layers is a free layer with a variable ferromagnetic polarity.

At 510, a top electrode layer is formed over the magnetic tunnel junction stack.

At 512, a mask layer is formed and patterned over the top electrode layer. The patterned mask has outer sidewalls which are disposed over a central portion of the bottom electrode.

At 514, an etch is carried out with the patterned mask in place to expose an upper surface of a peripheral portion of the bottom electrode layer while a patterned top electrode and MTJ stack remain over the central portion of the bottom electrode.

At 516, sidewall spacers are formed over the exposed upper surface of the peripheral portion.

At 518, an inter-metal dielectric (IMD) layer is formed over the sidewall spacers.

At 520, the IMD layer is etched back, and an upper metal layer is formed over the top electrode. The upper metal layer, as formed, is in electrical contact with top electrode.

Advantageously, the method 500 includes a reduced number of processing steps as it does not require the use of a CMP operation on the bottom electrode. The above described method also helps in having a reduced thickness for the overall MRAM cell, which promotes a simple and cost effective structure.

While the disclosed methods (e.g., the method described by the flowchart 500, methods depicted in FIGS. 6-16, and un-illustrated methods) may be illustrated and/or described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 6 through 16, cross-sectional views of some embodiments of a semiconductor structure having an MRAM cell at various stages of manufacture are provided to illustrate an example consistent with the method of FIG. 5. Although FIGS. 6 through 16 are described in relation to FIG. 5's method, it will be appreciated that the structures disclosed in FIGS. 6 through 16 are not limited to the method, but instead may stand alone as structures independent of the method. Similarly, although the FIG. 5'a method is described in relation to FIGS. 6 through 16, it will be appreciated that FIG. 5's method is not limited to the structures disclosed in FIGS. 6 through 16, but instead may stand alone independent of the structures disclosed in FIGS. 6 through 16 and/or may use other structures.

Figure 6:
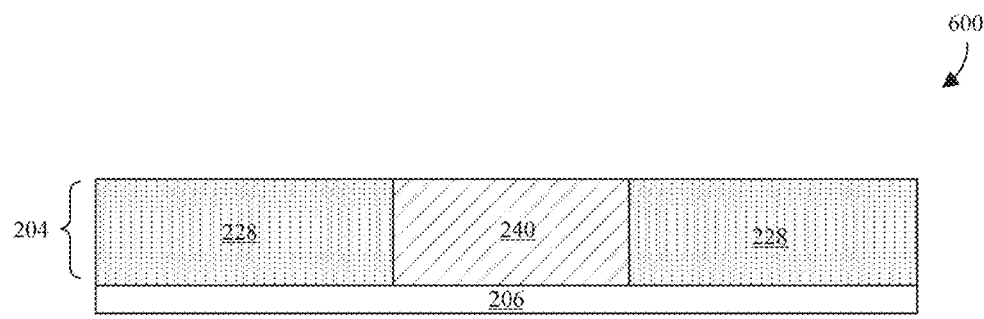
FIGS. 6 through 16 illustrate a series of incremental manufacturing steps as a series of cross-sectional views, according to the method of FIG. 5.

FIG. 6 illustrates a cross-sectional view 600 of some embodiments corresponding to Act 502 of FIG. 5.

In FIG. 6, a substrate 206 with an interconnect structure 204 disposed there over is provided. The interconnect structure 204 includes an IMD layer 228 and a metal line 240 which extends horizontally through the IMD layer 228. The IMD layer 228 can be an oxide, such as silicon dioxide, a low-κ dielectric material, or an extreme low-κ dielectric material. The metal line 240 can be made of a metal, such as aluminum, copper, or combinations thereof. In some embodiments, the substrate 206 can be a bulk silicon substrate or a semiconductor-on-insulator (SOI) substrate (e.g., silicon on insulator substrate). The substrate 206 can also be a binary semiconductor substrate (e.g., GaAs), a tertiary semiconductor substrate (e.g., AlGaAs), or a higher order semiconductor substrate, for example. In many instances, the substrate 206 manifests as a semiconductor wafer during the method 500, and can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); 450 mm (17.7 inch, usually referred to as "18 inch"); for example. After processing is completed, for example after MRAM cells are formed, such a wafer can optionally be stacked with other wafers or die, and is then singulated into individual die which correspond to individual ICs.

Figure 7:
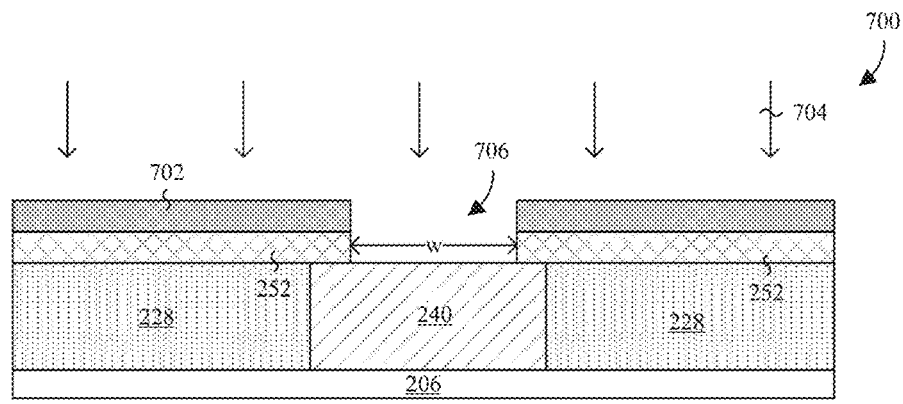

FIG. 7 illustrates a cross-sectional view 700 of some embodiments corresponding to Act 504 of FIG. 5.

In FIG. 7, a dielectric-protection layer is formed over IMD layer 228 and over metal line 240. After the dielectric-protection layer is formed, a first mask 702, such as a photoresist mask, is then formed over the dielectric-protection layer. A first etch 704 is then carried out with the first mask 702 in place to form patterned dielectric-protection layer 252. The dielectric-protection layer 252 is made of dielectric material, such as an oxide or ELK dielectric, and acts as an etch-stop layer. In some embodiments, the dielectric-protection layer 252 comprises SiC having a thickness of approximately 200 Angstroms. The first etch can be performed when a wet etchant or a plasma etchant is applied to the dielectric-protection layer 252 with the first mask 702 in place, and forms an opening 706. The opening 706 can have a width, w, which corresponds to a width of a via (e.g., via 246, FIG. 2) in the interconnect structure 204. The first mask 702 can be removed after the etching.

Figure 8:
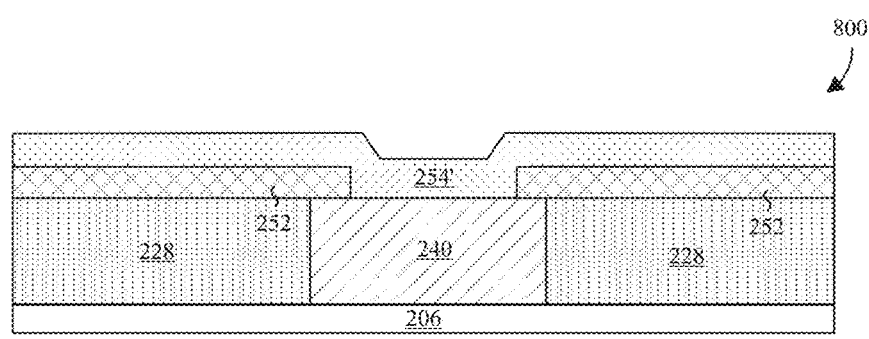

FIG. 8 illustrates a cross-sectional view 800 of some embodiments corresponding to Act 506 of FIG. 5.

In FIG. 8, a bottom electrode layer 254' is formed over the dielectric-protection layer 252, and extends downwardly into the opening 706 to make direct electrical contact with the metal line 240. The bottom electrode layer 254' is a conformal layer that may be a continuous conductive body. The bottom electrode layer 254' may be a conductive material, such as, for example, titanium nitride, tantalum nitride, titanium, tantalum, or a combination of one or more of the foregoing. Further, the bottom electrode layer 254' may be, for example, about 10-100 nanometers thick in some embodiments.

Figure 9:
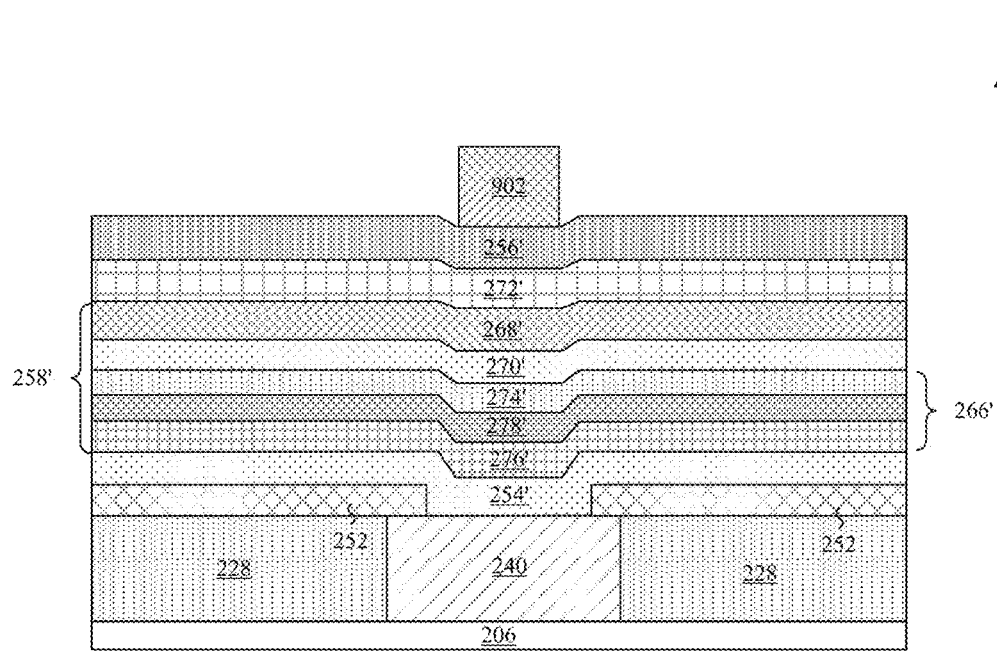

FIG. 9 illustrates a cross-sectional view 900 of some embodiments corresponding to Acts 508, 510, and 512 of FIG. 5.

In FIG. 9, a magnetic tunneling junction (MTJ) stack 258' is formed over an upper surface of the bottom electrode layer 254', a capping layer 272' is formed over MTJ stack 258', and a top electrode layer 256' is formed over the capping layer 272'. The MTJ stack 258' comprises a lower ferromagnetic layer 266', a tunneling barrier layer 270', and an upper ferromagnetic layer 268'. In some embodiments, the lower ferromagnetic layer 266' has a fixed magnetic polarity, and includes lower and upper ferromagnetic electrode layers 276', 274', respectively, with a metal layer 278' disposed there between. In these embodiments, the upper ferromagnetic layer 268' can be configured to switch between at least two magnetic polarities. In some embodiments, the lower ferromagnetic layer 266' comprises FePt or CoFeB having a thickness ranging between approximately 8 angstroms and approximately 13 angstroms, and the upper ferromagnetic layer 268' comprises single or multiple layers of Co, Ni or Ru. The top electrode layer 256' may be a conductive material, such as, for example, titanium nitride, tantalum nitride, titanium, tantalum, or a combination of one or more of the foregoing. Further, the top electrode layer 256' may be, for example, about 10-100 nanometers thick. A mask 902 is disposed over an upper surface of the top electrode layer 256'. In some embodiments, the mask 902 is a photoresist mask, but can also be a hard mask such as a nitride mark.

Figure 10:
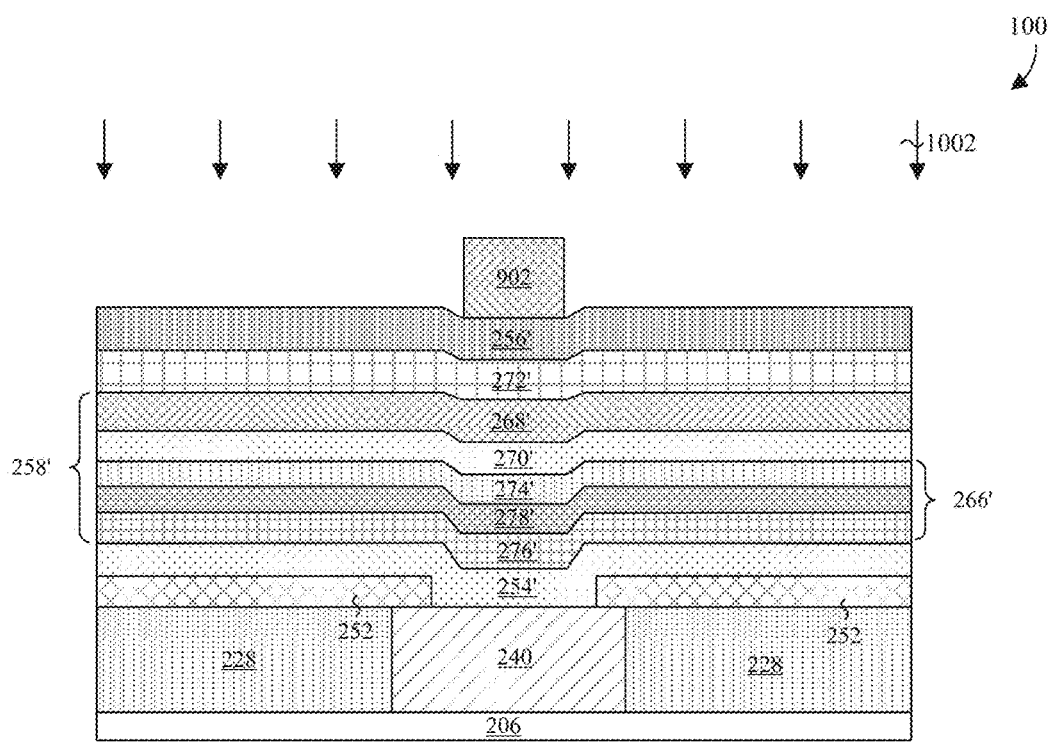
Figure 11:
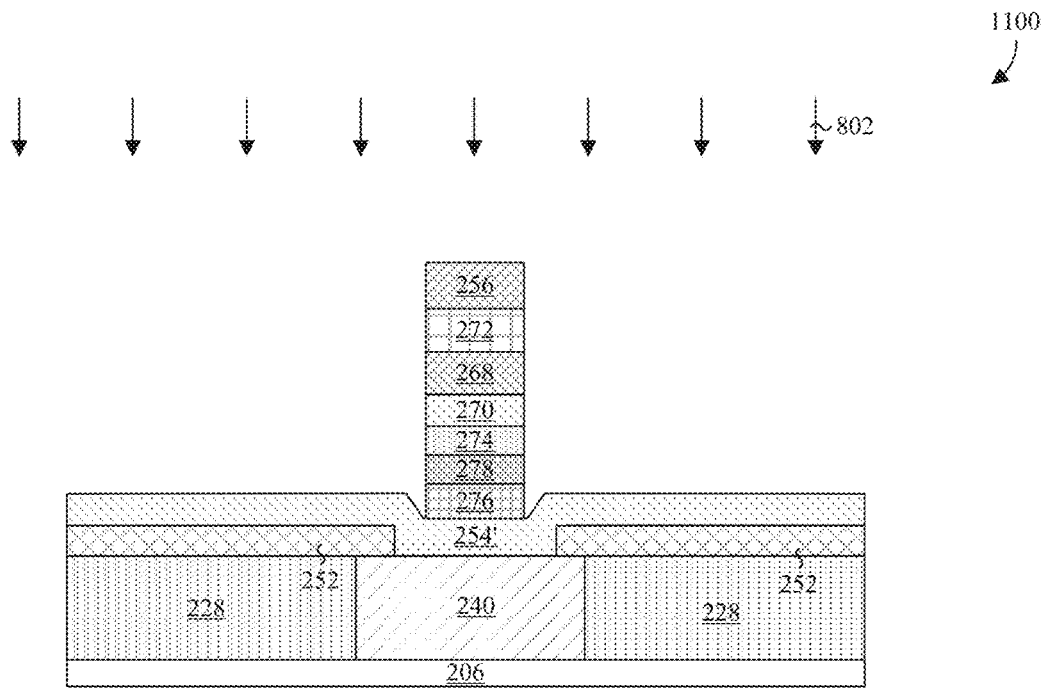

FIGS. 10-11 illustrate cross-sectional views 1000, 1100 of some embodiments corresponding to Act 514 of FIG. 5.

As illustrated by FIG. 10, with the mask 902 in place, a second etch 1002 is performed. The second etch 1002 proceeds through regions of top electrode layer 256', capping layer 272', and MTJ stack 258' which are not covered by mask 902. In some embodiments, the second etch 1002 comprises, applying a wet etchant or a plasma etchant for a predetermined period of time, and results in the structure of FIG. 11. Thus, the second etch 1002 removes portions of the MTJ stack not covered by the mask 902 and stops on the bottom electrode layer 254'.

Figure 12:
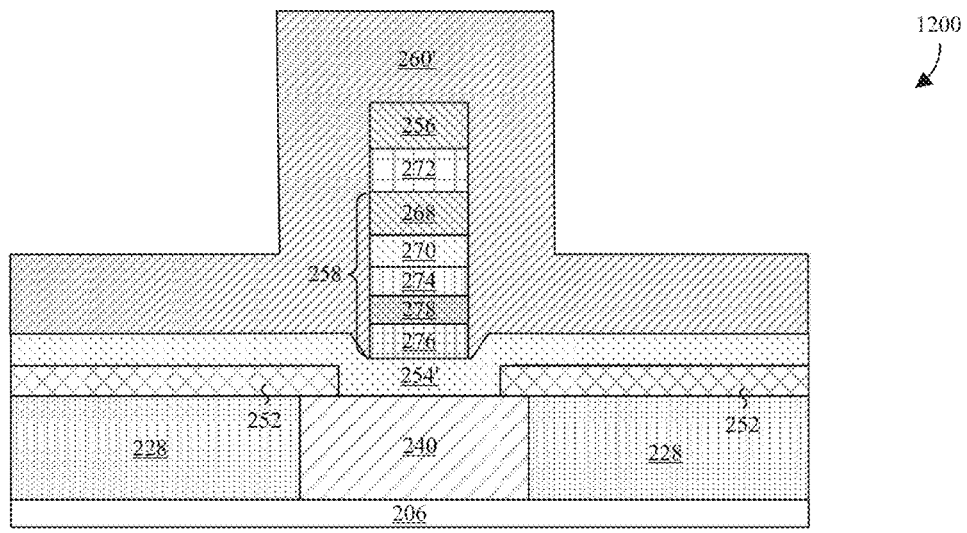
Figure 13:
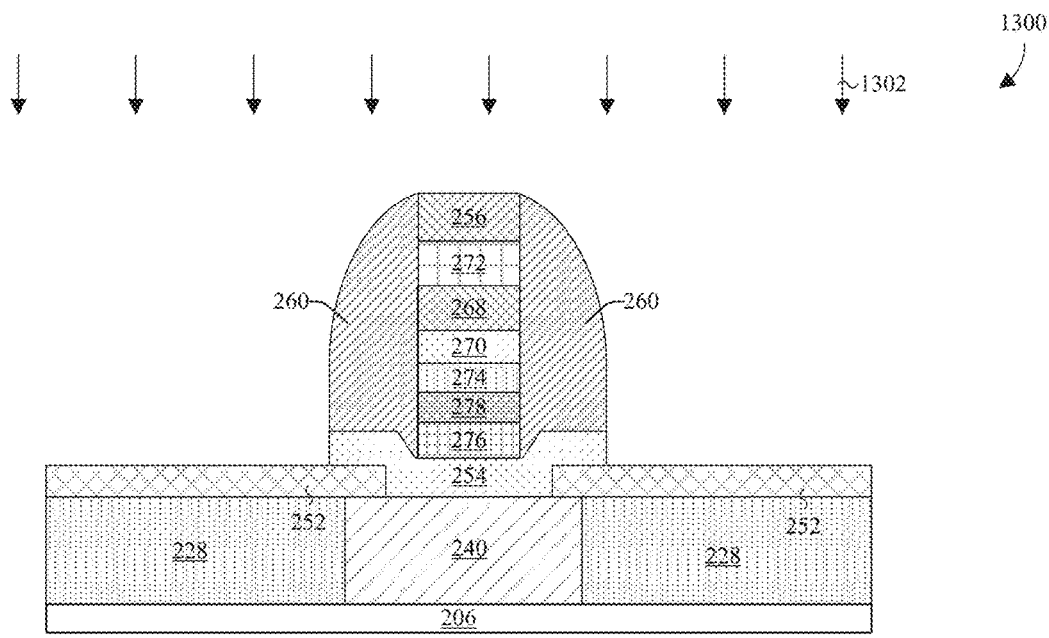

FIGS. 12-13 illustrate cross-sectional views 1200, 1300 of some embodiments corresponding to Act 516 of FIG. 5.

As illustrated in FIG. 12, a sidewall spacer layer 260' is formed over the structure, lining the upper surface and sidewalls of the capping layer 272, top electrode 256, and MTJ 258. In some embodiments, the sidewall spacer layer 260' may be formed by any suitable deposition technique and is typically formed conformally. Further, the sidewall spacer layer 260' may be formed of, for example, silicon nitride, silicon carbide, or a combination of one or more of the foregoing. Even more, the sidewall spacer layer 260' may be formed with a thickness of, for example, about 500 Angstroms.

In FIG. 13, a third etch 1302 is performed into the sidewall spacer layer 260' to etch sidewall spacer layer 260' back to remove lateral stretches of the sidewall spacer layer 260', thereby forming sidewall spacers 260. The third etch 1302 also removes lateral stretches of the bottom electrode layer 254' to form a bottom electrode 254. In some embodiments, the process for performing the third etch 1302 includes exposing the sidewall spacer layer 260' to an etchant for a predetermined period of time sufficient to etch through the thickness of the sidewall spacer layer 260' and the bottom electrode layer 254'. The etchant is typically preferential of the sidewall spacer layer 260' and the bottom electrode layer 254', relative to the dielectric-protection layer 252. In some embodiments, the upper outer corners of sidewall spacers 260 may be more or less squared-off or rounded, compared to the illustration of FIG. 13.

Figure 14:
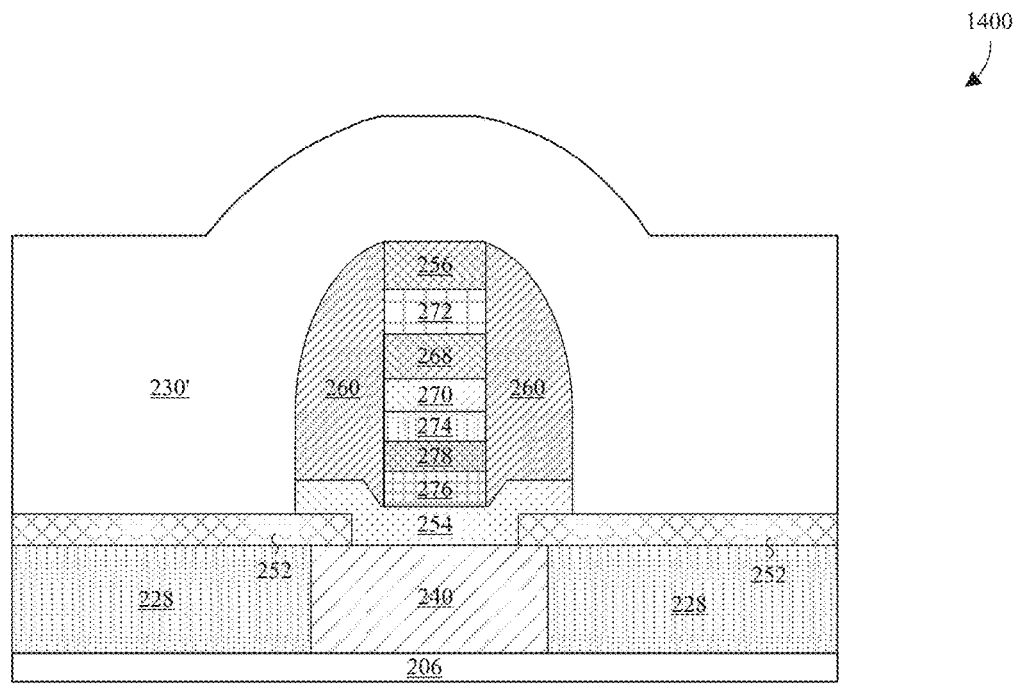
Figure 15:
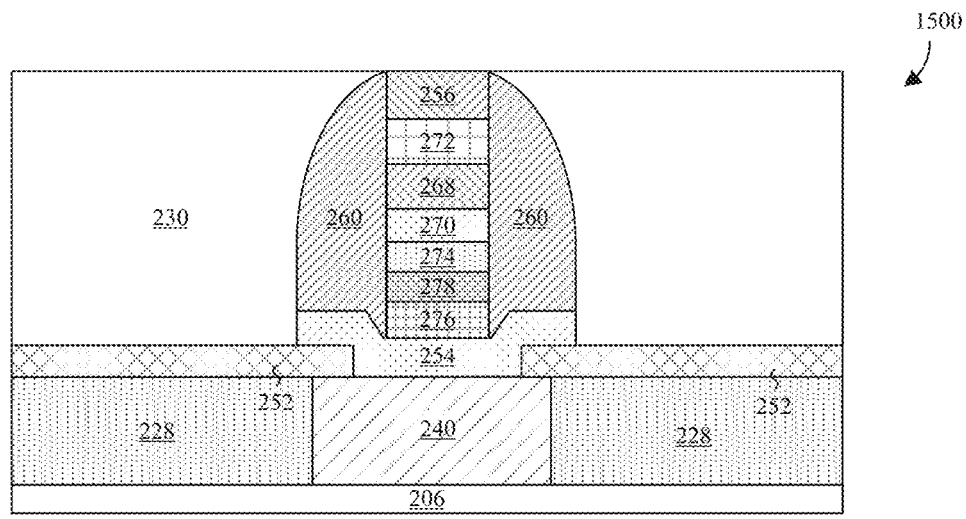

FIGS. 14-15 illustrates cross-sectional views 1400, 1500 of some embodiments corresponding to Act 518 of FIG. 5.

As illustrated in FIG. 14, an IMD layer 230' is formed over the structure. In some embodiments, IMD layer 230' may be formed by any suitable deposition technique and is typically formed conformally. Further, the IMD layer 230' may be formed of, for example a low-κ dielectric layer or an ELK dielectric layer, to a thickness of approximately 2650 Angstroms. If an ELK dielectric layer is used, a curing process is typically followed after depositing the ELK dielectric layer to increase its porosity, lower its k value, and improve its mechanical strengths.

In FIG. 15, the IMD layer 230 has been etched back to substantially planarize an upper surface of the IMD layer 230. In some embodiments, this etch back is achieved by wet or dry etching rather than chemical mechanical planarization (CMP). Further, in some embodiments, this etch back may be divided into one etch used to planarize the IMD over the MRAM regions and another etch to planarize the IMD over logic regions on the wafer or IC.

Figure 16:
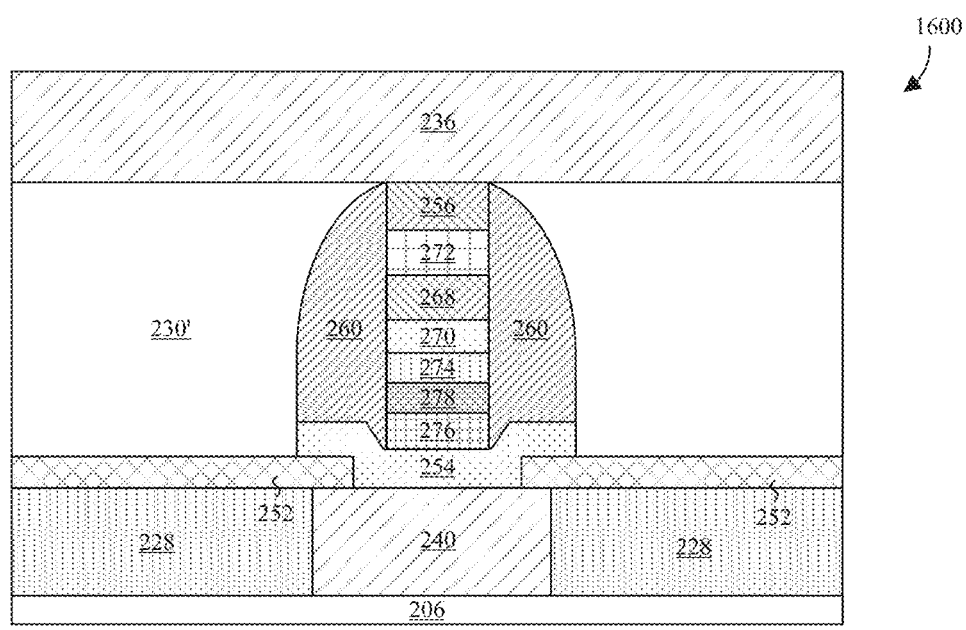

FIG. 16 illustrates cross-sectional view 1600 of some embodiments corresponding to Act 520 of FIG. 5.

In FIG. 16, an upper metallization layer 236 is formed over the planar top surface of the top electrode 256. The upper metallization layer 236 can be a metal line or via and can abut an entire surface area of the top electrode 256, thereby providing an electrical connection (e.g., ohmic connection) to the MRAM cell 202a. In some embodiments, the upper metallization layer 236 comprises copper, aluminum, tungsten, or combinations thereof.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

Thus, as can be appreciated from above, some embodiments relate to a magnetoresistive random-access memory (MRAM) cell. The cell includes a bottom electrode having a central bottom electrode portion surrounded by a peripheral bottom electrode portion. Step regions of the conductive bottom electrode couple the central and peripheral bottom electrode portions to one another such that an upper surface of the central portion is recessed relative to an upper surface of the peripheral portion. A magnetic tunneling junction (MTJ) has MTJ outer sidewalls which are disposed over the bottom central electrode portion and which are arranged between the step regions. A top electrode is disposed over an upper surface of the MTJ. Other devices and methods are also disclosed.

Other embodiments relate to a method for manufacturing a magnetoresistive random access memory (MRAM) cell. the method including: forming a dielectric layer over a semiconductor substrate; forming an opening in the dielectric layer, and filling the opening with a metal layer; forming an etch stop layer disposed over the upper surface of the dielectric layer, wherein the etch stop layer exhibits an opening that leaves at least a portion of the upper surface of the metal line or via exposed; forming a conformal bottom electrode layer over the etch stop layer and the metal layer, wherein the conductive bottom electrode layer includes a peripheral portion overlying the etch stop layer and a central portion extending downward through the opening to the upper surface of the metal line or via; and forming a magnetic tunnel junction over the central portion of the conformal conductive bottom electrode layer.

Still other embodiments relate to an integrated circuit. The integrated circuit includes a semiconductor substrate and an interconnect structure disposed over the semiconductor substrate. The interconnect structure includes a plurality of dielectric layers and a plurality of metal layers stacked over one another in alternating fashion. A metal layer includes a metal line having an upper surface which is at least substantially planar with an upper surface of a dielectric layer adjacent to the metal line. A dielectric-protection layer is disposed over the upper surface of the dielectric layer and exhibits an opening over at least a portion of the upper surface of the metal line. A conductive bottom electrode extends downwardly through the opening in the dielectric protection layer to come into direct electrical contact with the metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit including a magnetoresistive random access memory (MRAM) cell, comprising:
  a semiconductor substrate;
  a via disposed over the semiconductor substrate;
  a metal line disposed over the via;
  an etch stop layer partially covering an upper surface of the metal line;
  a bottom electrode over the etch stop layer, wherein the bottom electrode includes a peripheral portion overlying the etch stop layer and a central portion extending downward through an opening in the etch stop layer to contact the upper surface of the metal line, wherein the central portion of the bottom electrode has a width that is equal to a width of the via;
  a magnetic tunnel junction (MTJ) over the central portion of the bottom electrode;
  a top electrode over the MTJ;
  an inter-metal dielectric (IMD) layer over the etch stop layer and the bottom electrode; and
  sidewall spacers, separating the MTJ from the IMD layer, which extend over an upper surface of the peripheral portion of the bottom electrode, along sidewalls of the MTJ, and along sidewalls of the top electrode, wherein the sidewalls of the MTJ are in direct contact with inner sidewalls of the sidewall spacers, wherein the sidewall spacers have an outer sidewall which is a continuous arc from the upper surface of the peripheral portion of the bottom electrode to a top surface of the top electrode.

2. The integrated circuit of claim 1, wherein the bottom electrode is made of titanium nitride, tantalum nitride, titanium, tantalum, or combinations thereof.

3. The integrated circuit according to claim 1, wherein the magnetic tunnel junction comprises:
  a lower ferromagnetic electrode disposed over the central portion of the bottom electrode;
  a tunneling barrier layer disposed over the lower ferromagnetic electrode;
  an upper ferromagnetic electrode disposed over the tunneling barrier layer; and wherein one of the lower and upper ferromagnetic electrodes has a fixed magnetic orientation while the other of the lower and upper ferromagnetic electrodes has a variable magnetic orientation.

4. The integrated circuit of claim 1, wherein a step portion of the bottom electrode couples the central and peripheral portions of the bottom electrode to one another such that an upper surface of the central portion is recessed relative to an upper surface of the peripheral portion, and wherein the metal line is in direct electrical contact with the bottom electrode without a via or contact coupling the metal line to the bottom electrode.

5. The integrated circuit of claim 4, wherein the central portion, the step portion, and the peripheral portion are a continuous seamless body.

6. The integrated circuit of claim 4, wherein the central portion of the bottom electrode is substantially and continuously planar within an innermost perimeter of the step portion.

7. The integrated circuit of claim 4, wherein the step portion of the bottom electrode extends downwardly along inner sidewalls of the etch stop layer to adjoin the central portion of the bottom electrode.

8. The integrated circuit of claim 7, wherein the etch stop layer does not extend directly under the central portion of the bottom electrode.

9. The integrated circuit of claim 8:
wherein the metal line extends horizontally through a dielectric layer, and wherein the etch stop layer extends over the dielectric layer.

10. An integrated circuit including a magnetoresistive random access memory (MRAM) cell arranged in an interconnect structure over a semiconductor substrate, wherein the interconnect structure includes a metal line arranged over a via and an inter-metal dielectric (IMD) layer surrounding the metal line and the via, comprising:
a dielectric protection layer over an upper surface of the metal line;
a bottom electrode including a peripheral portion overlying the dielectric protection layer and a central portion extending through an opening in the dielectric protection layer to contact the upper surface of the metal line, wherein the central portion of the bottom electrode has a width that is equal to a width of the via;
a magnetic tunnel junction over the central portion of the bottom electrode;
a top electrode over the magnetic tunnel junction; and
sidewall spacers arranged over an upper surface of the peripheral portion of the bottom electrode and separating the IMD layer from the magnetic tunnel junction, wherein the sidewall spacers have outer sidewalls which are substantially planar from the upper surface of the peripheral portion of the bottom electrode to a top surface of the sidewall spacers or which monotonically increase in height from the upper surface of the peripheral portion of the bottom electrode to a top surface of the top electrode, wherein sidewalls of the magnetic tunnel junction and sidewalls of the top electrode are in direct contact with the sidewall spacers.

11. The integrated circuit of claim 10, wherein a step portion of the bottom electrode couples the central and peripheral portions of the bottom electrode to one another such that an upper surface of the central portion is recessed relative to the upper surface of the peripheral portion.

12. The integrated circuit of claim 11, wherein the step portion of the bottom electrode extends downwardly along inner sidewalls of the dielectric protection layer to adjoin the central portion of the bottom electrode.

13. The integrated circuit of claim 12, wherein the dielectric protection layer does not extend directly under the central portion of the bottom electrode.

14. The integrated circuit of claim 12:
wherein the metal line extends horizontally through a dielectric layer, and wherein the dielectric protection layer extends over the dielectric layer.

15. The integrated circuit of claim 11, wherein the central portion, the step portion, and the peripheral portion are a continuous seamless body.

16. An integrated circuit including a magnetoresistive random access memory (MRAM) cell arranged in an interconnect structure over a semiconductor substrate, wherein the interconnect structure includes a metal line arranged over a via, comprising:
an etch stop layer over an upper surface of the metal line;
a bottom electrode including a peripheral portion overlying the etch stop layer and a central portion extending through an opening in the etch stop layer to contact the upper surface of the metal line, wherein the central portion of the bottom electrode has a width that is equal to a width of the via;
a magnetic tunnel junction over the central portion of the bottom electrode, the magnetic tunnel junction having a lower surface at a height that is below a height of the upper surface of the peripheral portion of the bottom electrode;
a top electrode over the magnetic tunnel junction;
sidewall spacers arranged over an upper surface of the peripheral portion of the bottom electrode, wherein the sidewall spacers have outer sidewalls which are substantially planar from the upper surface of the peripheral portion of the bottom electrode to a top surface of the sidewall spacers or which are a continuous arc from the upper surface of the peripheral portion of the bottom electrode to a top surface of the top electrode, wherein a top of the bottom electrode is in direct contact with a bottom surface of the sidewall spacers; and
an inter-metal dielectric layer, adjacent to the sidewall spacers, covering the bottom electrode, the sidewall spacers, and the etch stop layer.

17. The integrated circuit of claim 16, wherein a step portion of the bottom electrode couples the central and peripheral portions of the bottom electrode to one another such that an upper surface of the central portion is recessed relative to an upper surface of the peripheral portion.

18. The integrated circuit of claim 17, wherein the central portion, step portion, and peripheral portion are a continuous seamless body.

19. The integrated circuit of claim 18, wherein the central portion of the bottom electrode is substantially and continuously planar within an innermost perimeter of the step portion.

20. The integrated circuit of claim 19, wherein the bottom electrode is made of titanium nitride, tantalum nitride, titanium, tantalum, or combinations thereof.

* * * * *